United States Patent
Miyamoto et al.

(10) Patent No.: US 9,201,786 B2
(45) Date of Patent: Dec. 1, 2015

(54) MEMORY CONTROLLER AND MEMORY SYSTEM

(71) Applicant: Kabushiki Kaisha Toshiba, Minato-ku (JP)

(72) Inventors: Arata Miyamoto, Tokyo (JP); Hiroshi Yao, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 150 days.

(21) Appl. No.: 13/958,861

(22) Filed: Aug. 5, 2013

(65) Prior Publication Data

US 2014/0181376 A1   Jun. 26, 2014

Related U.S. Application Data (60) Provisional application No. 61/745,306, filed on Dec. 21, 2012.

(51) Int. Cl.
*G06F 12/02* (2006.01)
*G11C 16/34* (2006.01)

(52) U.S. Cl.
CPC .......... *G06F 12/0246* (2013.01); *G11C 16/349* (2013.01); *G06F 2212/7211* (2013.01)

(58) Field of Classification Search
CPC ................ G06F 12/0246; G06F 2212/7211; G11C 16/349

USPC ...................... 711/103, E12.008; 365/185.33
See application file for complete search history.

(56) References Cited

U.S. PATENT DOCUMENTS

| | | | |
|---|---|---|---|
| 5,737,742 A | 4/1998 | Achiwa et al. | |
| 5,930,193 A | 7/1999 | Achiwa et al. | |
| 7,876,616 B2 | 1/2011 | Reid et al. | |
| 8,200,891 B2 | 6/2012 | Mukaida et al. | |
| 8,447,915 B2 * | 5/2013 | Araki et al. | 711/103 |
| 2010/0161880 A1 | 6/2010 | You | |
| 2010/0318719 A1 | 12/2010 | Keays et al. | |
| 2011/0191521 A1 * | 8/2011 | Araki et al. | 711/103 |
| 2012/0317345 A1 | 12/2012 | Pan et al. | |
| 2013/0036253 A1 | 2/2013 | Baltar | |

FOREIGN PATENT DOCUMENTS

| | | |
|---|---|---|
| JP | 8-16482 | 1/1996 |
| JP | 2010-515127 | 5/2010 |
| JP | 2011-103077 | 5/2011 |

* cited by examiner

*Primary Examiner* — Han Yang
*Assistant Examiner* — Xiaochun L Chen
(74) *Attorney, Agent, or Firm* — Oblon, McClelland, Maier & Neustadt, L.L.P.

(57) ABSTRACT

According to an embodiment, a retention time of each block group is managed and a degree of wear of each block is managed. A free block allocated to each block group is determined based on the retention time of each block group and the degree of wear of each block.

20 Claims, 10 Drawing Sheets

MEMORY CONTROLLER AND MEMORY SYSTEM

CROSS-REFERENCE TO RELATED APPLICATIONS

This application is based upon and claims the benefit of priority from U.S. Provisional Patent Application No. 61/745,306, filed on Dec. 21, 2012; the entire contents of which are incorporated herein by reference.

FIELD

Embodiments described herein relate generally to a memory controller controlling a nonvolatile semiconductor memory and a memory system.

BACKGROUND

Due to a physical structure, a semiconductor memory such as a NAND flash memory wears and reaches the end of its life at a predetermined number of times of rewriting. In this semiconductor memory, wear leveling needs to be performed to level the degree of wear between blocks in order to increase a storage life thereof. Wear leveling control includes dynamic wear leveling that performs a write/erase on blocks in ascending order of the number of times of rewriting, and static wear leveling that performs data exchange from a block with a high number of times of rewriting to a block with a low number of times of rewriting on which a rewrite is not performed for a long time.

DETAILED DESCRIPTION

According to an embodiment, a memory controller include a block group managing unit, a retention time managing unit, a degree of wear managing unit, and a block selecting unit. The block group managing unit is configured to manage a plurality of block groups, each block group including active blocks of a nonvolatile semiconductor memory, the block being erase unit of the nonvolatile semiconductor memory. The retention time managing unit is configured to manage a retention time of each block group that is an indicator of a block allocation period of each block group. The degree of wear managing unit is configured to manage a degree of wear of each block. The block selecting unit is configured to select a free block to allocate to each block group based on the retention time of each block group and the degree of wear of each block.

A NAND flash memory includes a plurality of physical blocks, each one of the plurality of blocks is a data erasing unit. Also, in a memory system such as an SSD (Solid State Drive), a virtual block called a logical block is mostly defined as the unit of consolidating and managing a plurality of physical blocks. The plurality of physical blocks in the logical block can operate in parallel, and the logical block is the erase unit.

Such a logical block (hereinafter, simply referred to as a block) is mostly divided and managed into some categories that are referred to as block groups. The block group is the unit of consolidating active blocks, in which valid data is or can be stored, according to use applications. On the other hand, a free block is an empty block that is not allocated to a block group. The free block is managed in a free block list, and does not belong to any block group. In each block group, a new block is added from the free block list by a predetermined rule, and data according to the application of the block group is written. Also, valid data may move to another block in each block group according to a predetermined rule. A block having a valid data amount of 0 by data movement is released as a free block. After being released as a free block, the block is erased until data is newly written. An indicator indicating the time during which each allocated block will continue to exist in a block group, that is, an indicator of a block allocation period of a block group will be referred to as a retention time of the block group.

An increasing rate of a number of times of rewriting of a free block allocated to a block group with a long retention time can be suppressed to be lower than an increasing rate of a number of times of rewriting of a free block allocated to a block group with a short retention time.

Therefore, in the embodiment, in order to level the degree of wear of the block between block groups, a free block is allocated to each block group based on the retention time of each block group and the degree of wear of each block. Specifically, by allocating a block with a large number of times of rewriting, that is, a large degree of wear to a block group with a long retention time, an increase of the number of times of rewriting of the block is delayed. On the other hand, by allocating a block with a small degree of wear to a block group with a short retention time, an increase of the number of times of rewriting of the block is accelerated.

When the retention time of each block group changes, the possibility of minimizing the number of times of rewriting variation when allocating which block to which block group changes dynamically. Therefore, in the embodiment, dynamic wear leveling is adopted that sequentially calculates/updates the retention time of each block group and dynamically changes block allocation according to the calculation result.

The dynamic wear leveling has the advantage of being able to deal with the case where a relative retention time between block groups is reversed by an access pattern. When a block allocation rule is fixed regardless of the retention time, the dynamic wear leveling may increase the number of times of rewriting variation when the retention time is reversed. Also, when an action (compaction technique or the like) of an algorithm operating in the memory controller is changed, or when various parameters (spare capacity size and the like) are changed, the same reversion may occur. Even when the retention time is reversed due to some reason, the technique can optimally reduce the number of times of rewriting variation by adaptively adjusting an action of wear leveling.

Hereinafter, a memory controller and a memory system according to embodiments will be described in detail with reference to the accompanying drawings. Also, the present invention is not limited by these embodiments.

(First Embodiment)

Figure 1:
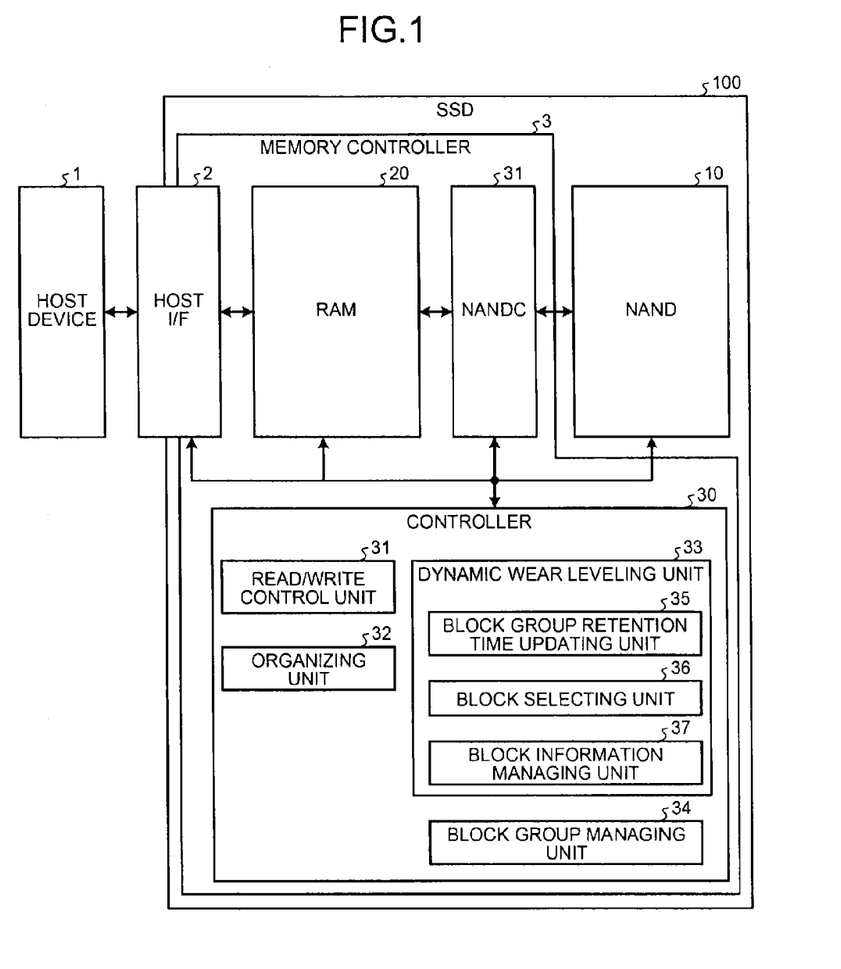
FIG. 1 is a functional block diagram illustrating an internal configuration of an SSD.

FIG. 1 illustrates an example of a configuration of an SSD (Solid State Drive) 100 as a memory system. The SSD 100 is connected through a host interface 2 to a host device (hereinafter, simply referred to as a host) 1, and functions as an external storage device of the host 1. The host 1 is, for example, a personal computer, a portable phone, an imaging device, or the like.

The SSD 100 includes a NAND flash 10 (hereinafter, simply referred to as a NAND) as a nonvolatile semiconductor memory, and a memory controller 3. The memory controller 3 includes a host interface 2, a NAND controller (NANDC) 31, a RAM 20, a controller 30, and the like.

The NAND 20 stores user data received from the host 1, management information of the SSD 100, system data, and the like. The NAND 20 includes a memory cell array in which a plurality of memory cells are arranged in a matrix configuration. Each memory cell can perform multilevel storage by using an upper page and a lower page. The NAND 20 includes a plurality of arranged blocks that are data erase units. Also, each block includes a plurality of pages. Each page is the data write/read unit. The NAND 20 includes, for example, a plurality of memory chips.

The RAM 20 includes a storage region configured to temporarily store data written from the host 1 into the NAND 10, and a storage region configured to store and update management information such as an address mapping table mapping a logical address (for example, LBA) received from the host 1 and a storage position of data on the NAND 10. The management information is backed up in the NAND 10.

The NANDC 31 includes, for example, a NAND I/F performing interface processing with the NAND 10, an error correction circuit, a DMA controller, and the like. Under the control of the controller 30, the NANDC 31 writes data temporarily stored in the RAM 20 into the NAND 10, or reads data stored in the NAND 10 and transmits the read data to the RAM 20.

In the SSD 100, a virtual block called a logical block is defined as the unit of consolidating and managing a plurality of physical blocks. For example, the logical block includes physical blocks that are combined to perform at least one parallel processing such as channel paralleling, bank interleaving, and plain double-speed operation. As described above, the logical block is classified into an active block and a free block.

The controller 30 includes a read/write control unit 31, a organizing unit 32, a dynamic wear leveling unit 33, and a block group managing unit 34.

The read/write control unit 31 performs processing of writing data to be written to the NAND 10 through the RAM 20 into the NAND 10 and processing of reading data from the NAND 10. Also, the read/write control unit 31 performs management information update processing along with a write operation on the NAND 10.

The organizing unit 32 performs data organizing (compaction) in the NAND 10. In the SSD, if the data erase unit (block) is different from the data read/write unit, when a rewrite is performed on the NAND 10, a block is holed by invalid (non-latest) data. When the number of holed blocks increases, the number of actually-available blocks decreases and the storage region of the NAND 10 cannot be effectively used. Therefore, for example, when the number of free blocks of the NAND 10 is smaller than a predetermined threshold value, an application-unallocated free block is secured by performing organizing of the NAND 10 such as compaction that collects valid data inside a logical block and rewrites the collected data into another logical block. The organizing unit 32 performs management information update processing along with the compaction.

The dynamic wear leveling unit includes a block group retention time updating unit 35, a block selecting unit 36, and a block information managing unit 37 to perform dynamic wear leveling. The block group managing unit 34 performs management and replacement of blocks belonging to each block group.

The block group retention time updating unit 35 updates/stores a retention time of each block group to manage the retention time of each block group. The block information managing unit 37 updates/stores statistical information of each block such as the degree of wear of each block to manage the statistical information of each block. The block selecting unit 36 determines a free block allocated to each block group based on the retention time of each block group and the degree of wear of each block.

Figure 2:
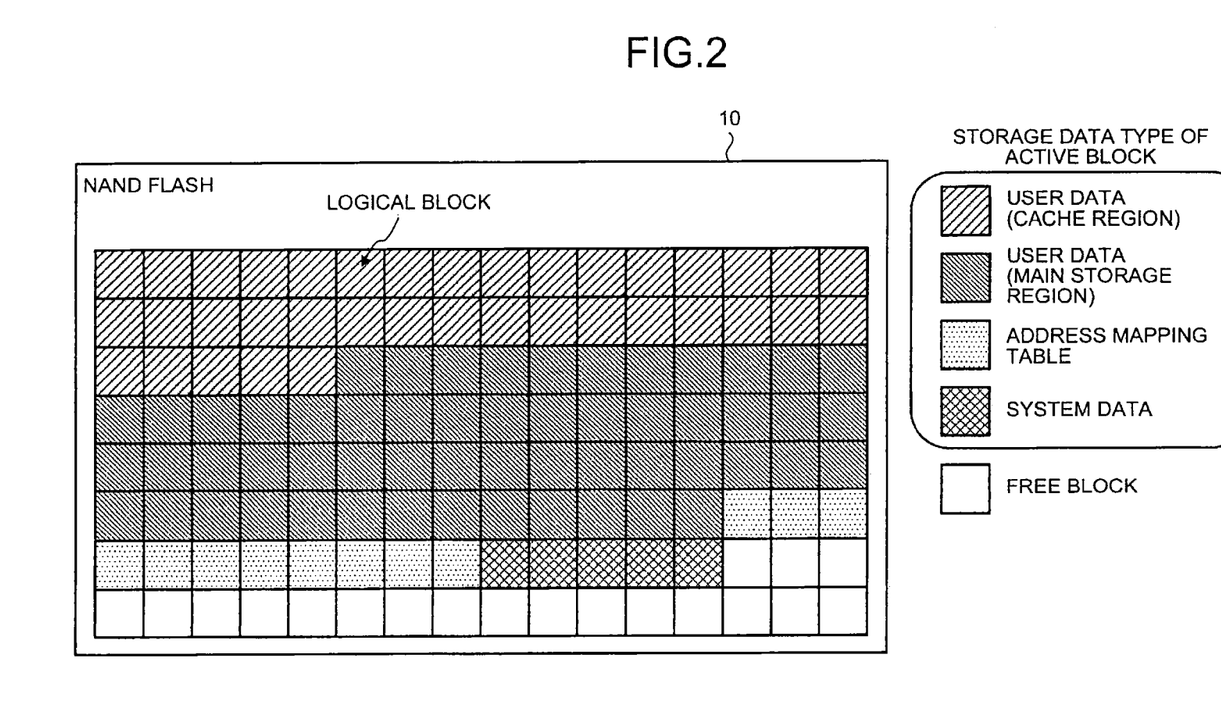
FIG. 2 is a diagram illustrating a plurality of block groups.

FIG. 2 illustrates a plurality of block groups classified. In addition, for convenience sake, FIG. 2 illustrates that blocks of the same block group are consecutively juxtaposed. However, in reality, blocks of different block groups may be alternately juxtaposed. The block group managing unit 34 of the controller 30 divides active blocks on the NAND 10 into a plurality of block groups and manages the plurality of block groups. In FIG. 2, active blocks and free blocks are illustrated, and the active blocks are classified into, for example, four block groups. The free blocks can be used in any one block group among the plurality of block groups. As described above, the block group is the unit of consolidating active blocks according to use applications. In FIG. 2, the active blocks are classified into a block group used to store user data in a temporary cache region, a block group used to store user data in a main storage region, a block group used to store an address mapping table, and a block group used to store system data other than the address mapping table, which is retained in the SSD 100. The data other than the user data, which is managed in the SSD 100, is broadly divided into an address mapping table and system data (other than the address mapping table). When a cache region and a main storage region are defined, data written in the NAND 10 is generally stored temporarily in the cache region and then stored in the main storage region.

Figure 3:
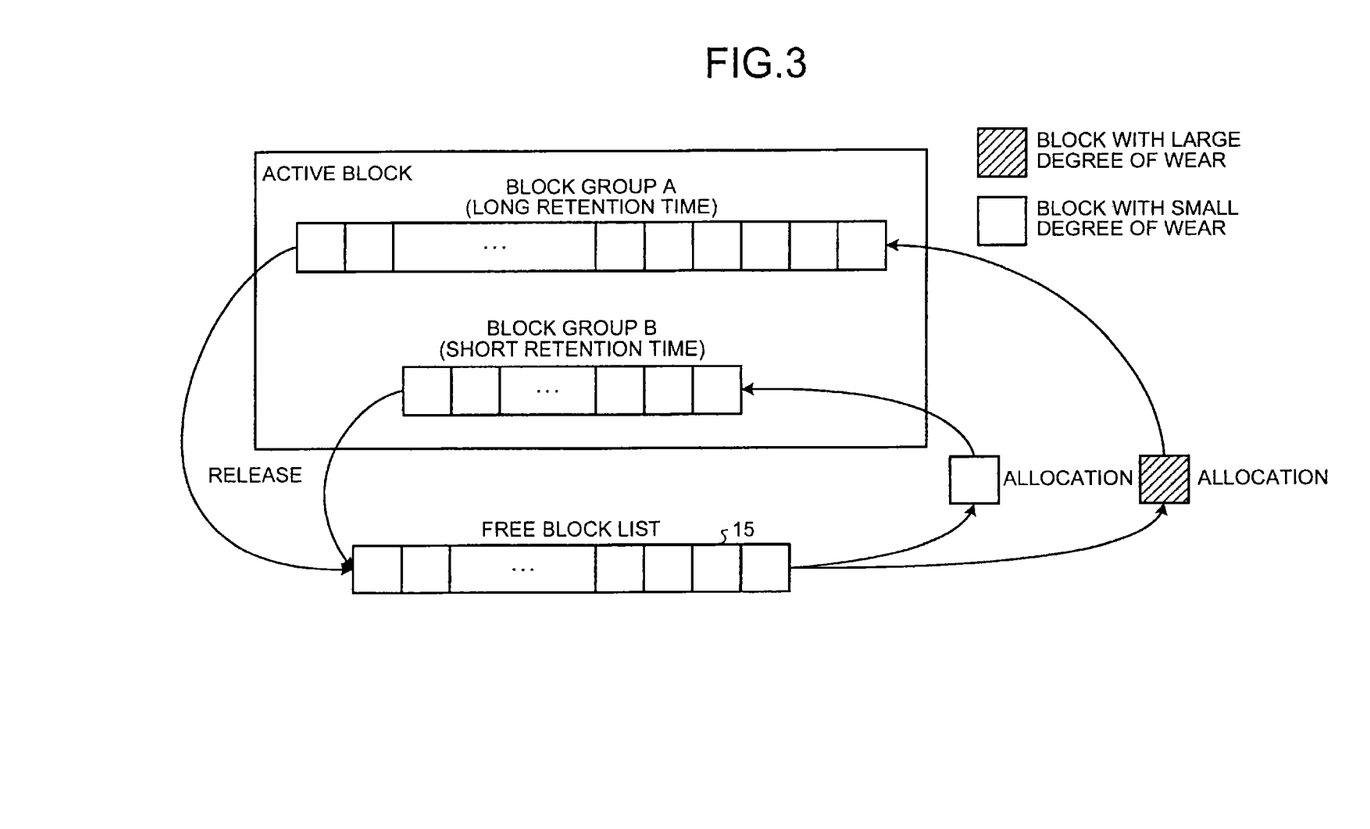
FIG. 3 is a conceptual diagram illustrating wear leveling according to an embodiment.

FIG. 3 conceptually illustrates an example of a dynamic wear leveling technique in the embodiment. Herein, for simplicity sake, it is assumed that there are two block groups: a block group A and a block group B. As described above, the active block is a block that may be referred to because including valid data. Although not including valid data, an unreleased block as a free block is classified as an active block. The free block can be used in any one of the block groups A and B, and is managed in a free block list 15. That is, the block used in the block group A can also be used in the block group B, and vice versa. In the free block list 15, block IDs are managed in a FIFO manner in the order of release from the block groups.

Dynamic wear leveling is performed on the two block groups A and B based on a retention time. For example, as for a block released as a free block, a block retention time is obtained by measuring the time taken from the allocation of a block to any block group to the release of the block into the free block list 15. Also, as another method, a block retention time may be defined to include also a retention time within the free block list. For example, as for a block released as a free block, a block retention time may be obtained by measuring the time taken from the previous release to the current release. Also, as for a block allocated as an active block to a block group, a block retention time may be obtained by measuring the time taken from the previous allocation to the current allocation. When a block retention time is defined as the time taken from the previous allocation to the current allocation, the block retention time is updated not at the block release time but at the block allocation time.

When a write command is issued from the host 1, or when a data movement occurs between blocks by compaction or the like, a data write operation occurs on the block. Data written by the host 1 (in the former case) or a copy of valid data having remained in a compaction source block (in the latter case) is written into any one write target block among the block groups A and B. In this case, when the write target block is filled and no more data can be written therein, a new block needs to be allocated from the free block list to the block group.

When an allocation target free block is selected, the retention times of the block groups A and B are referred to. As illustrated in FIG. 3, when the retention time of the block group A is longer than the retention time of the block group B, a block with a large degree of wear among the free block list 15 is allocated to the block group A and a block with a small degree of wear among the free block list is allocated to the block group B. On the other hand, when the retention time of the block group A is shorter than the retention time of the block group B, a block with a small degree of wear is allocated to the block group A and a block with a large degree of wear is allocated to the block group B.

For example, a number of times of block erasing is used as a block degree of wear.

Figure 4:
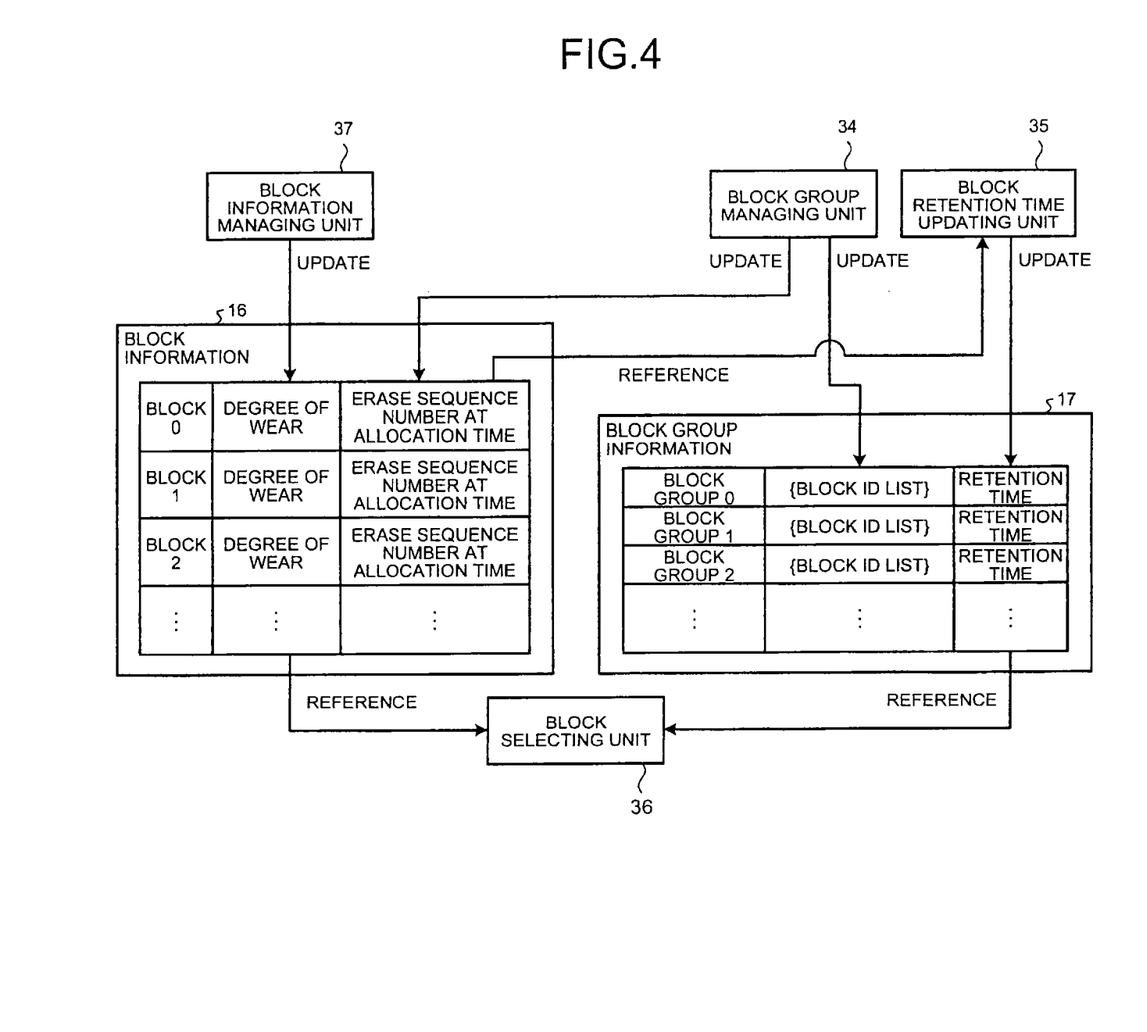
FIG. 4 is a diagram illustrating management information used in wear leveling.

FIG. 4 illustrates management information used in dynamic wear leveling. The management information includes block information 16 and block group information 17. The block information 16 manages a degree of wear and an erase sequence number with respect to each block ID (for example, a block number) identifying each block when the block is allocated to a block group. A total number of times of erasing in view of the entire NAND 10 is referred to as an erase sequence number, and is a counter value that is incremented one by one regardless of a block group whenever one block is erased. Therefore, by acquiring an erase sequence number when a block is allocated to a block group, the time of allocating the block to the block group can be managed.

The block group information 17 manages a retention time and a block ID list representing one or more blocks included in a relevant block group, with respect to each block group ID (for example, a block group number) identifying each block group.

Figure 5:
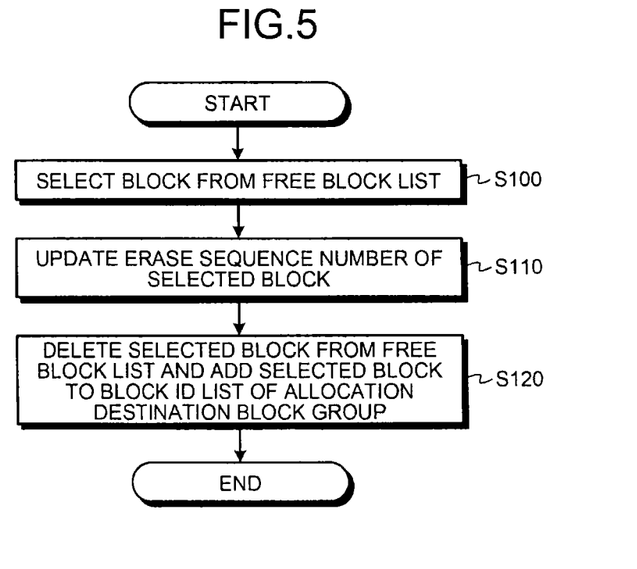
FIG. 5 is a flow chart illustrating a procedure of allocating a block to a block group.

FIG. 5 illustrates a procedure of allocating a block to a block group. As illustrated in FIG. 3, the block selecting unit 36 selects a free block allocated from the free block list 15 to a block group, based on the retention time of a block group and the degree of wear of a block (step S100). A free block selection order will be described below with reference to FIG. 8. The block information managing unit 37 acquires an erase sequence number corresponding to a free block selected by the block selecting unit 36 when a block is allocated to a block group, and updates an erase sequence number corresponding to the block number among the block information 16 by the acquired erase sequence number (step S110). By this update, the time of allocating the selected free block to the block group can be known. Next, the block information managing unit 37 deletes a block ID of the selected free block from the free block list 15. Also, the block group managing unit 34 updates the block group information 17 to add a selected block ID to a block ID list of the block group to which the selected free block is allocated (step S120).

Figure 6:
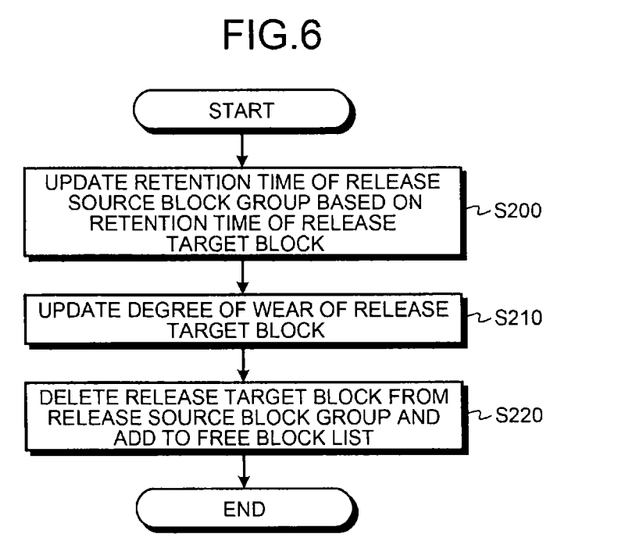
FIG. 6 is a flow chart illustrating a procedure of releasing a block from a block group.

FIG. 6 illustrates a procedure of releasing a block from a block group. The block group retention time updating unit 35 updates a retention time of a release source block group based on the retention time of a release target block when a block is released from the block group (step S200). In the embodiment, the block group retention time updating unit 35 obtains the retention time of each block with reference to the erase sequence number. The block group retention time updating unit 35 obtains the retention time of a released block (release source) by using the following equation (1) when the block is release d.

(Retention Time of released Block)=(Erase Sequence Number at Block release)−(Erase Sequence Number at Block Allocation)     (1)

Also, the block group retention time updating unit 35 updates the retention time of a block group when a block belonging to the block group is released into the free block list. The retention times of the block group A and the block group B are respectively updated by, for example, the following equations. Herein, the retention time of the block group is set to have an initial value of 0.

(Retention Time of Block Group $A$ after Update)= (Retention Time of Block Group $A$ before Update)×$W$+(Retention Time of Block released from Block Group $A$)×(1−$W$) (0≤$W$≤1)     (2)

(Retention Time of Block Group $B$ after Update)= (Retention Time of Block Group $B$ before Update)×$W$+(Retention Time of Block released from Block Group $B$)×(1−$W$)     (3)

In Equations (2) and (3), an moving average of a weight W is taken by the previous retention time and the latest retention time, and the retention times are leveled by the moving average of the weight W. Since the ration of the previous retention time increases with an increase in the weight W, it becomes less sensitive to an outlier. However, when an access pattern changes suddenly, the time taken for the retention time to follow increases.

Figure 7:
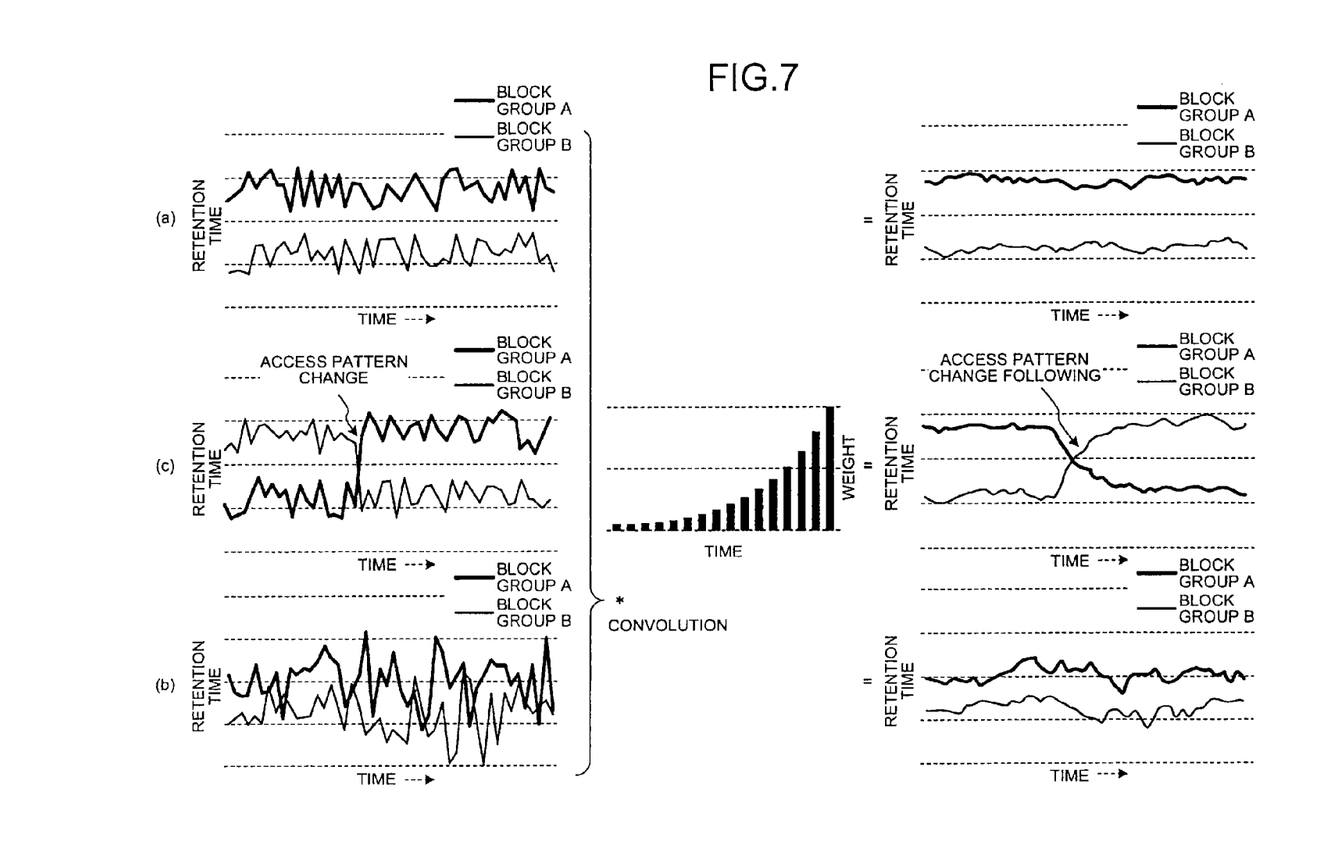
FIG. 7 is a diagram illustrating a temporal change of the retention time of a block that is released last, and a temporal change of the retention time in the case where a weighted moving average is taken, in a block group A and a block group B.

FIG. 7 illustrates a temporal change of the retention time of a block that is released last, and a temporal change of the retention time in the case where a weighted moving average is taken according to Equations (2) and (3), in the block group A and the block group B. As illustrated in the bar graph of FIG. 7, the more recent block retention time, the more greatly contributes to the weighted moving average. That is, the retention time of the last-released block is added with a weight W to the moving average, the retention time of the block released one ahead thereof is added with a weight W×(1−W) to the moving average, and the retention time of the block released one ahead thereof is added with a weight W×(1−W)$^2$ to the moving average. In FIGS. 7(a) and 7(b), the retention time is not reversed in the block group A and the block group B. However, in FIG. 7(c), the retention time is reversed in the block group A and the block group B.

As "Retention Time of Released Block" used in Equation (1), a logical time such as a total number of times of erasing (erase sequence number) counted by a counter or the like progressed according to the use of a storage may be used. Also, a real time may be used instead of the logical time. Also, as other logical times, there are a total number of times of block allocation, a total number of times of block release, and the like in the entire storage (NAND).

Also, in Equation (2), the retention time is set to have an initial value of 0. However, as another example, the retention time may be set to have an initial value equal to the number of logical blocks in the NAND 10. If all of the blocks have an equal retention time, the retention time of each block group is equal to the number of logical blocks. Therefore, this value may be considered as being close to the actual retention time of the block group rather than 0.

Next, the block information managing unit 37 updates the degree of wear of a release target block among the block information 16 (step S210). When the number of times of erasing is used as the degree of wear, the number of times of erasing is incremented. Also, the block group managing unit 34 updates the block group information 17 to delete a block ID of a release target block from a block ID list of the block group to which the release target block is allocated. Also, the block information managing unit 37 adds the block ID of the release target block to the free block list 15.

Figure 8:
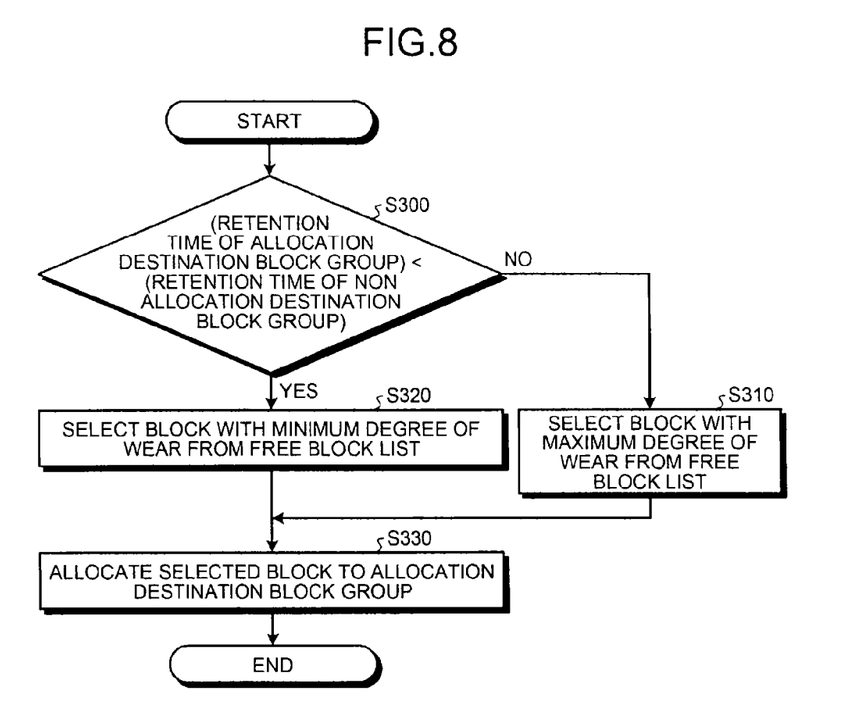
FIG. 8 is a flow chart illustrating an allocation block selection processing procedure.

FIG. 8 illustrates an allocation block selection processing procedure. When selecting a block, with reference to the degree of wear of each block and the retention time of each block group, the block selecting unit 36 allocates a free block with a large degree of wear among the free block list to a block group with a large retention time, and allocates a free block with a small degree of wear among the free block list to a block group with a small retention time.

In FIG. 8, it is assumed that two block groups are included as illustrated in FIG. 3. Therefore, the block selecting unit 36 compares the retention time of an allocation destination block group with the retention time of a non allocation destination block group (step S300). When the retention time of an allocation destination block group is equal to or longer than the retention time of a non allocation destination block group (No in step S300), the block selecting unit 36 selects a block with the maximum degree of wear from the free block list 15 (step S310). Also, when the retention time of an allocation destination block group is shorter than the retention time of a non allocation destination block group (Yes in step S300), the block selecting unit 36 selects a block with the minimum degree of wear from the free block list 15 (step S320). The block selecting unit 36 notifies the block information managing unit 37 and the block group managing unit 34 of the selected block (step S330).

In this manner, in the embodiment, based on the retention time of each block group, a block with a large degree of wear is allocated to a block group with a large retention time, and a block with a small degree of wear is allocated to a block group with a small retention time. Therefore, the embodiment is effective in the case where the retention time of a block group can be dynamically changed. As an example of the case where the retention time of a block group can be dynamically changed as illustrated in FIG. 7(b), there is a case where block group management is performed by a variable-length cache scheme together with the dependency on an access pattern (Japanese Patent Application Laid-open No. 2012-68986).

The variable-length cache scheme is a kind of scheme that uses two block groups: the block group of the cache region and the block group of the main storage region described above, and the ration of the number of cache blocks to the number of main blocks changes dynamically according to the valid data amount or the like. The magnitude relation between both block groups may change. For example, when the number of cache blocks is larger than the number of main blocks, the retention time of the cache block group increases, and when the number of main blocks is larger than the number of cache blocks, the retention time of the main block group increases. Therefore, as in the embodiment, when blocks with different degree of wear are allocated dynamically according to the retention time, it can be expected that the leveling efficiency can be improved by wearing leveling.

(Second Embodiment)

In the first embodiment 1, the number of times of erasing of each block in the free block list is used as an indicator of the degree of wear. However, a numerical value other than the number of times of erasing may also be used as an indicator of the degree of wear. In the second embodiment, when data of a block is erased, a fixed value (increment value of degree of wear) determined for each block group is added to the degree of wear of the block according to the block group from which the block was released before the erasure.

This method is effective in the case where the degree of wear after the use of a block is different according to each block group. As an example of the case where the degree of wear is different according to each block group, there are pseudo SLC (Single Level Cell) writing and MLC (Multi Level Cell) writing. The pseudo SLC writing indicates writing only 1-bit/cell data in an MLC cell. The MLC writing indicates the case of writing multi-bit/cell (for example, 2-bit/cell) data in an MLC cell. In the case of erasing a pseudo-SLC-written block, and in the case of erasing an MLC-written block, there is a case where the degree of wear received per write/erase cycle is different.

On the other hand, in the variable-length cache scheme described above and the fixed-length cache scheme, a method can be conceived that uses pseudo SLC writing in a cache block group and uses MLC writing in a main storage block group. Since the pseudo SLC writing can be processed at a higher speed than the MLC writing, the performance improvement can be expected by treating a pseudo-SLC-written block as a cache block group and treating an MLC-written block group as a main storage block group.

In this case, the respective block groups are a group of only pseudo-SLC-written blocks and a group of only MLC-written blocks. Therefore, when a block is erased, the degree of wear by the use of a pseudo SLC is added to the release target block in the case of a block released from the cache block group, and the degree of wear by the use of an MLC is added to the release target block in the case of a block released from the main block group. If the ratio of the degree of wear by the use of a pseudo SLC to the degree of wear by the use of an MLC is $1:\alpha$, a degree of wear of 1 may be added to a block released from an SLC block group and a degree of wear of $\alpha$ may be added to a block released from an MLC block group.

Also, in the first embodiment, a scheme of counting an number of times of erasing and uses the number of times of erasing as an indicator of the degree of wear corresponds to the case where a degree of wear increment is set to 1 in all block groups in an erase mode.

(Third Embodiment)

In the first embodiment, a block with a minimum degree of wear is allocated to the block group with a short retention time among two block groups, and a block with a maximum degree of wear is allocated to the block group with a long retention time. However, a block with a maximum or minimum degree of wear may not necessarily be allocated, and other techniques may be adopted.

(Scheme X)

Figure 9:
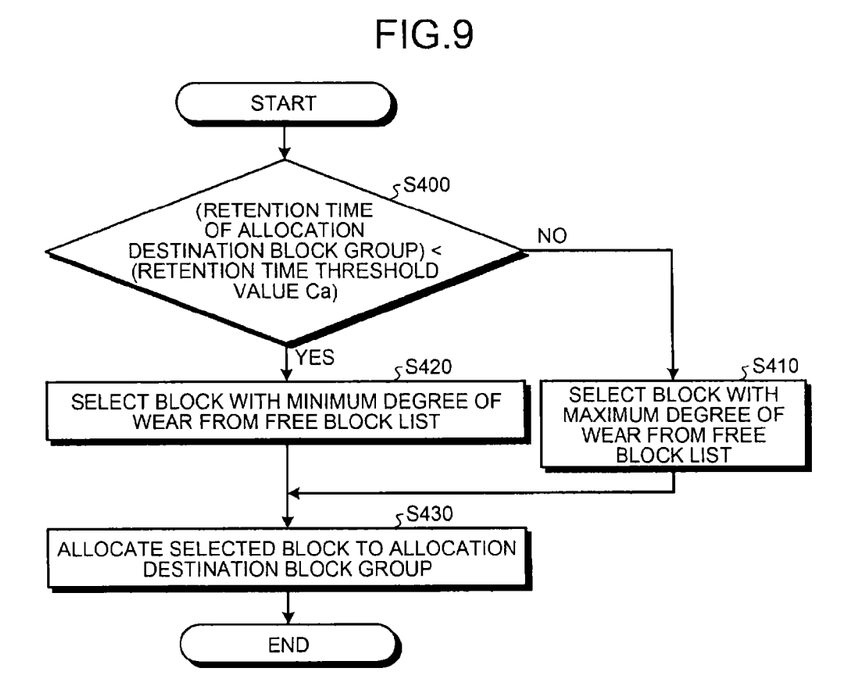
FIG. 9 is a flow chart illustrating another allocation block selection processing procedure.

A threshold value Ca is defined with respect to the retention time. FIG. 9 illustrates an operation procedure of the scheme X. The retention time of an allocation destination block group is compared with the threshold value Ca (step S400). When a block group has a retention time smaller than the threshold value Ca (Yes in step S400), a block with a minimum degree of wear is selected among the free block list and is allocated to the block group (steps S420 and S430). When a block group has a retention time larger than the threshold value Ca (No in step S400), a block with a maximum degree of wear is selected and allocated to the block group (steps S410 and S430) In the scheme X, when the retention times of both block groups are smaller than the threshold value Ca, a block with a minimum degree of wear may also be allocated to both block groups.

(Scheme Y)

A threshold value Cb is defined with respect to the retention time. When the retention time of one block group is larger than the retention time of another block group and the difference therebetween is equal to or larger than the threshold value Cb, a block with a maximum degree of wear is allocated to the block group with a large retention time and a block with a minimum degree of wear is allocated to the block group with a small retention time. When the difference between the retention times of the block groups is smaller than the threshold value Cb, a block with a minimum degree of wear is allocated to both block groups.

(Scheme Z)

A block with a second-largest degree of wear among the free block list is allocated to a block group with a large retention time, and a block with a minimum degree of wear is allocated to a block group with a small retention time.

Any one of the above schemes may achieve the better result than the first embodiment according to a specific access pattern or the configuration of the controller 30. Also, unlike the other schemes, the scheme X is not limited to the case of two block groups but can be applied to the case of one or more block groups.

(Fourth Embodiment)

In the first embodiment, when a block allocated to a block group is selected, a block satisfying the condition of a maximum degree of wear or a minimum degree of wear is searched among all blocks included in the free block list. However, in the fourth embodiment, only a predetermined number of leading blocks are searched among the free block list. That is, a block with a maximum degree of wear among a predetermined number of leading blocks from the free block list is allocated to a block group with a large retention time, and a block with a minimum degree of wear among a predetermined number of leading blocks from the free block list is allocated to a block group with a small retention time. Blocks are arranged in the free block list in the order of release. Therefore, in this technique, a plurality of blocks whose release time is old are selected among the released blocks in descending order of release time age, and a plurality of selected free blocks are allocated to a block group.

By restricting a search target block, the following advantages a and b are achieved.

a. A block located at the rear of the free block list is not an allocation candidate. Therefore, a block added to the free block list within a short period immediately after release can be prevented from being immediately re-allocated.

b. By restricting a search range, the time taken to search is shortened even when a large number of blocks are included in the free block list.

(Fifth Embodiment)

In the first embodiment, when the retention time of a block group is updated, a weighted average is taken between the past retention time of the block group and the retention time of a released block. However, a technique other than weighting may be adopted.

For example, a method can also be conceived that takes a median value of the retention times of a plurality of blocks in the block group within a predetermined past period. In order to obtain the median value, a retention time history of a predetermined number of blocks released in the past during a predetermined past period is retained in each block group. When a block is allocated from the free block list to a specific block group, the median value or the maximum value of the retention time history of the block group is used as the current retention time of the block group.

Using the median value provides the advantage of being able to eliminate the influence of a block with an extremely long or short retention time. Therefore, even when there was an outlier block with a retention time greatly different from the average, a robust operation can be performed without receiving the influence thereof.

(Sixth Embodiment)

In the first embodiment, the retention time of a block group is updated only when a block is released from the block group.

In the sixth embodiment, when a block is released from one of a pair of block groups, the retention time of the block group from which a block is not released is also updated simultaneously. This solves the problem of deviation from the actual retention time, because the retention time of a block group is not updated when a block release from the block group does not occur for a long time.

In this case, in the block group from which a block is not released, the retention time is updated in the following manner. A block released from a block group is generally a block that is selected as a compaction source by compaction. Therefore, by assuming that a compaction also occurs in the block group from which a block is not released, a block first selected as a compaction source is selected. The retention time of the block group is updated based on Equation (2) by using the retention time of the selected block.

(Seventh Embodiment)

In the dynamic wear leveling technique according to the first embodiment, the retention times are compared between only two block groups. Therefore, in this scheme, even when there are three or more block groups, the retention times are compared between only two block groups.

Figure 10:
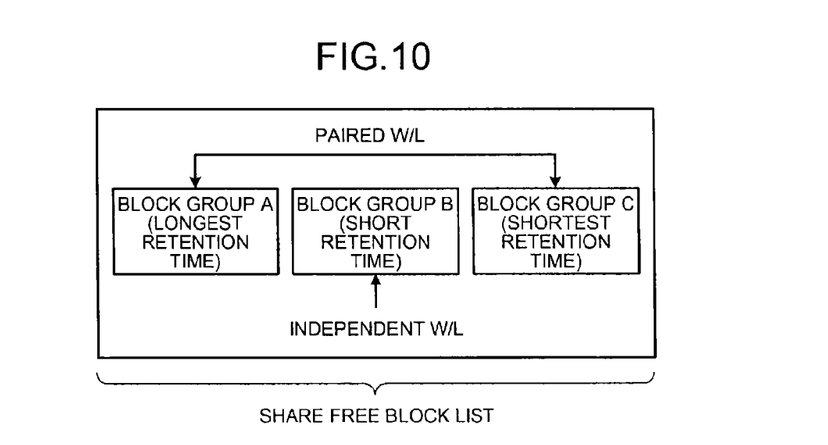
FIG. 10 is a conceptual diagram illustrating an example of dynamic wear leveling in the case of three block groups.

For example, a case where there are three block groups is considered. As illustrated in FIG. 10, it is assumed that three block groups A, B and C are present and the magnitude relation between retention times thereof is A>B >C. Also, the three block groups share one free block list. Dynamic wear leveling based on the retention time illustrated in FIG. 8 is performed between two block groups: the block group A with the longest retention time and the block group C with the shortest retention time. On the other hand, dynamic wear leveling is performed independently on the block group B having the medium retention time among the three block groups. For example, a method can be conceived that allocates a block with the lowest degree of wear to the block group B. Alternatively, as for the block group B, as illustrated in the scheme X of the third embodiment, a block with the minimum degree of wear may be allocated to a block group with a retention time smaller than a threshold value Ca, and a block with the minim degree of wear may be allocated to a block group with a retention time larger than the threshold value Ca.

Also, the retention time order (A>B>C) may not be fixed. When the access pattern changes, the retention time order may also change. When the retention time order has changed, wear leveling is performed in pairs on a block group with the maximum retention time and a block group with the minimum retention time based on a new retention time order. For example, when the retention time order changes into A>C>B, wear leveling is performed between the block group A and the block group B based on the retention times and wear leveling is performed independently on the block group C.

Figure 11:
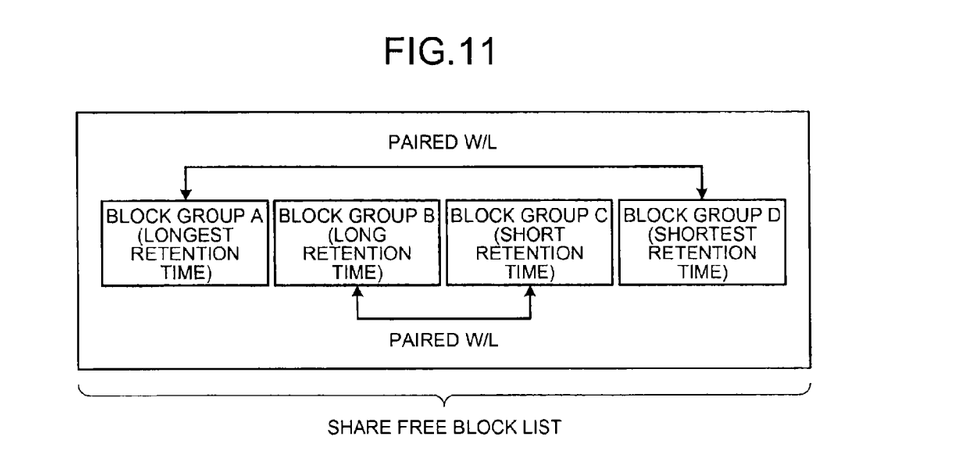
FIG. 11 is a conceptual diagram illustrating an example of dynamic wear leveling in the case of four block groups.

On the other hand, a case where there are four block groups can also be considered. For example, likewise, as illustrated in FIG. 11, it is assumed that block groups A, B, C and D are present and the magnitude relation between retention times thereof is A>B>C>D. As described above, the retention time order may also change according to an access pattern or the like. The four block groups share one free block list. Dynamic wear leveling based on the retention times illustrated in FIG. 8 is performed between the block group A with the longest retention time and the block group D with the shortest retention time. Also, likewise, dynamic wear leveling based on the retention times illustrated in FIG. 8 is performed between the block group B with the second-longest retention time and the block group C with the third-longest retention time.

Also, as illustrated in FIG. 11, when the retention times of the block groups are classified into four groups of longest, long, short and shortest retention times, the degree of wear of the block is classified into four groups of maximum, large, small and minimum degree of wear. A block with the maximum degree of wear is allocated to the block group with the longest retention time, a block with the large degree of wear is allocated to the block group with the long retention time, a block with the small degree of wear is allocated to the block group with the short retention time, and a block with the minimum degree of wear is allocated to the block group with the shortest retention time. That is, in this technique, a free block with the larger degree of wear is allocated to a block group with the longer retention time.

As a specific example of three block groups, a configuration can be taken that includes a cache block group, a main storage block group, and an address mapping table block group among the plurality of block groups illustrated in FIG. 2. As a specific example of four block groups, a configuration of adding a system data block groups in addition to the cache block group, the main storage block group, and the address mapping table block group.

Figure 12:
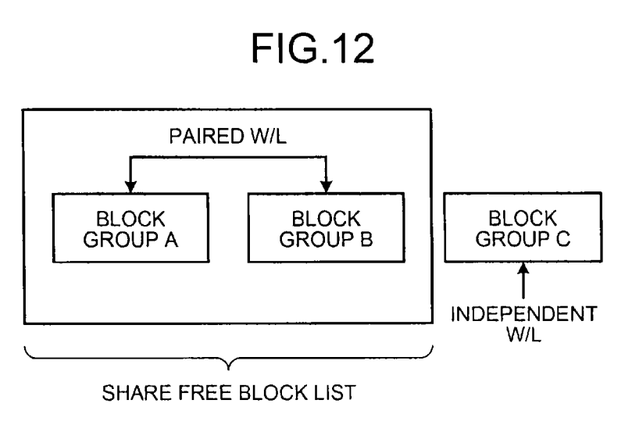
FIG. 12 is a conceptual diagram illustrating another example of dynamic wear leveling in the case of three block groups.

Also, as illustrated in FIG. 12, when there is a block group that does not share the free block list, dynamic wear leveling based on the retention times is performed only between the block groups sharing the free block list. On the block group not sharing the free block list, dynamic wear leveling is performed independently without the dependency of the retention times of other block groups.

(Eighth Embodiment)

Instead of updating the retention time dynamically at block release or at block allocation, the retention time of each block group may be allocated as a fixed value at system delivery. Alternatively, instead of retaining the retention times, the order of the lengths of the retention times of a block group may be stored. In this case, the retention time order does not change during operation, a block with a large degree of wear can always be allocated to a block group with a long retention time, and a block with a small degree of wear can always be allocated to a block group with a short retention time.

As an effective example of this scheme, there is a case where block management based on a fixed-length SLC scheme is used. In the fixed-length SLC scheme, pseudo SLC blocks and MLC blocks are mixed in the NAND 10, but unlike the variable-length SLC scheme, the number of pseudo SLC blocks is restricted not to exceed a threshold value. In this case, when the difference between the number of pseudo SLC blocks and the number of MLC blocks is sufficiently large, which retention time of block group is longer hardly depends on the access pattern. Therefore, the retention time need not be sequentially calculated during operation, and the retention time order may be fixed without any problem.

That is, as described above, when the cache block group (block group A) and the main storage block group (block group B) are present, it can be expected that the cache block has a short retention time and the main storage block has a long retention time. Therefore, at product delivery, the retention time of the block group A is set to be "high", and the retention time of the block group B is set to be "low". However, this setting is based on the assumption that the cache block group is smaller than the main storage block group and has a fixed length.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
    a block group managing unit configured to manage a plurality of block groups, each block group including a plurality of active blocks of a nonvolatile semiconductor memory, a block being an erase unit of the nonvolatile semiconductor memory;
    a retention time managing unit configured to manage a retention time of each block group, wherein the retention time of each block group indicates a time in which at least one block allocated to a respective block group is allocated to the respective block group;
    a degree of wear managing unit configured to manage a degree of wear of each block; and
    a block selecting unit configured to select a free block to allocate to each block group based on the retention time of each block group and the degree of wear of each block.

2. The memory controller according to claim 1, wherein the block selecting unit is configured to:
    allocate a block having a minimum degree of wear to a first block group having a minimum retention time, and
    allocate a block having a non-minimum degree of wear to a second block group having a retention time longer than the retention time of the first block group.

3. The memory controller according to claim 2, wherein the block selecting unit is configured to:
    allocate the block having the minimum degree of wear to the first block group, and
    allocate a block having a maximum degree of wear to the second block group.

4. The memory controller according to claim 1, wherein the block selecting unit is configured to:
   allocate a block having a minimum degree of wear to a block group having a retention time smaller than a threshold value, and
   allocate a block having a non-minimum degree of wear to a block group having a retention time larger than the threshold value.

5. The memory controller according to claim 1, wherein the retention time managing unit is configured to obtain the retention time of each block group based on the retention time of at least one block included in each block group.

6. The memory controller according to claim 5, wherein, the retention time managing unit is configured to obtain the retention time of the block group based on time period of released block from allocation to the block group to release from the block group.

7. The memory controller according to claim 5, wherein, the retention time managing unit is configured to obtain the retention time of the block group based on time period of allocated block from allocation to the block group to re-allocation to the block group.

8. The memory controller according to claim 5, wherein, the retention time managing unit is configured to obtain the retention time of the block group based on time period of released block from release from the block group to re-release from the block group.

9. The memory controller according to claim 5, wherein the retention time managing unit is configured to obtain the retention time of each block group by obtaining a weighted average of a retention time of a current block group and a retention time of a block released from the same block group.

10. The memory controller according to claim 5, wherein the retention time managing unit is configured to:
    retain a plurality of retention times of a plurality of blocks released from each block group during a predetermined period, and
    obtain the retention time of each block group based on the retained plurality of retention times of the plurality of blocks in each block group.

11. The memory controller according to claim 10, wherein the retention time managing unit is configured to manage a median value or a maximum value of the retained plurality of retention times of the plurality of blocks in each block group as the retention time of each block group.

12. The memory controller according to claim 5, wherein the retention time managing unit is configured to obtain a retention time of another block group when obtaining a retention time of a current block group.

13. The memory controller according to claim 10, wherein the retention time managing unit is configured to obtain the retention time of a block released from each block group by using an erase sequence number that is a total block number of times of erasing in the nonvolatile semiconductor memory.

14. The memory controller according to claim 1, wherein degree of wear of each block is determined based on a number of erase time of each block.

15. The memory controller according to claim 1, wherein the degree of wear managing unit is configured to manage the degree of wear of each block by setting a degree of wear increment value of each block group and adding the set degree of wear increment value whenever each block wears.

16. The memory controller according to claim 1, wherein
    when the difference between the retention time of one block group and the retention time of another block group is larger than a threshold value, the block selecting unit is configured to allocate a block having a minimum degree of wear to the block group having the shorter retention time and is configured to allocate a block having a non-minimum degree of wear to the block having the longer retention time, and
    when the difference between the retention time of one block group and the retention time of another block group is smaller than the threshold value, the block selecting unit is configured to allocate a block having a minimum degree of wear to both of the blocks.

17. The memory controller according to claim 1, wherein the block selecting unit is configured to:
    select a plurality of free blocks among all free blocks, and
    select a block allocated to each block group among the plurality of free blocks selected.

18. The memory controller according to claim 1, wherein the block selecting unit is configured to
    create a pair of block groups according to the retention time of each block group, and
    determine a free block allocated to each block group within the pair.

19. The memory controller according to claim 18, wherein the block selecting unit is configured to determine a free block allocated to a block group independently on the block group outside the pair.

20. A memory system comprising:
    a nonvolatile semiconductor memory including a plurality of blocks, a block being an erase unit of the nonvolatile semiconductor memory; and
    a memory controller configured to control the nonvolatile semiconductor memory,
    wherein the memory controller includes:
    a block group managing unit configured to manage a plurality of block groups, each block group including a plurality of active blocks of a nonvolatile semiconductor memory;
    a retention time managing unit configured to manage a retention time of each block group, wherein the retention time of each block group indicates a time in which at least one block allocated to a respective block group is allocated to the respective block group;
    a degree of wear managing unit configured to manage a degree of wear of each block; and
    a block selecting unit configured to select a free block to allocate to each block group based on the retention time of each block group and the degree of wear of each block.

* * * * *